(12) United States Patent
Katoh

(10) Patent No.: US 7,956,647 B2
(45) Date of Patent: Jun. 7, 2011

(54) CIRCUIT, APPARATUS AND METHOD OF TRANSMITTING SIGNAL

(75) Inventor: Toshihiro Katoh, Tokyo (JP)

(73) Assignee: NEC Corporation, Tokyo (JP)

( * ) Notice: Subject to any disclaimer, the term of this patent is extended or adjusted under 35 U.S.C. 154(b) by 177 days.

(21) Appl. No.: 12/320,640

(22) Filed: Jan. 30, 2009

(65) Prior Publication Data

US 2009/0212837 A1    Aug. 27, 2009

(30) Foreign Application Priority Data

Feb. 21, 2008   (JP) ................................ 2008-039792

(51) Int. Cl.
   *H03K 19/00*   (2006.01)
(52) U.S. Cl. ......................... 326/93; 326/101; 327/276
(58) Field of Classification Search .................. 327/261, 327/276; 361/816; 326/93, 101; 716/10; 257/211

See application file for complete search history.

(56) References Cited

U.S. PATENT DOCUMENTS

| 6,025,740 | A  | * | 2/2000 | Fukuyama ..................... 326/93 |
| 6,593,792 | B2 | * | 7/2003 | Fujii ............................. 327/276 |
| 6,998,654 | B2 | * | 2/2006 | Itoh et al. ..................... 257/211 |
| 7,719,317 | B2 | * | 5/2010 | Chueh et al. .................. 326/93 |

FOREIGN PATENT DOCUMENTS

JP    2001-230324    8/2001

* cited by examiner

*Primary Examiner* — Rexford N Barnie
*Assistant Examiner* — Crystal L Hammond
(74) *Attorney, Agent, or Firm* — McGinn IP Law Group, PLL

(57) ABSTRACT

A circuit includes a first wiring to transmit a first signal, an alteration element to adjust a delay amount being added to the first wiring, and a shield element to shield the alteration element from a second wiring, the second wiring transmitting a second signal.

29 Claims, 10 Drawing Sheets

Fig. 10
(A) 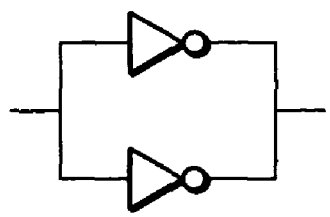
(B) 
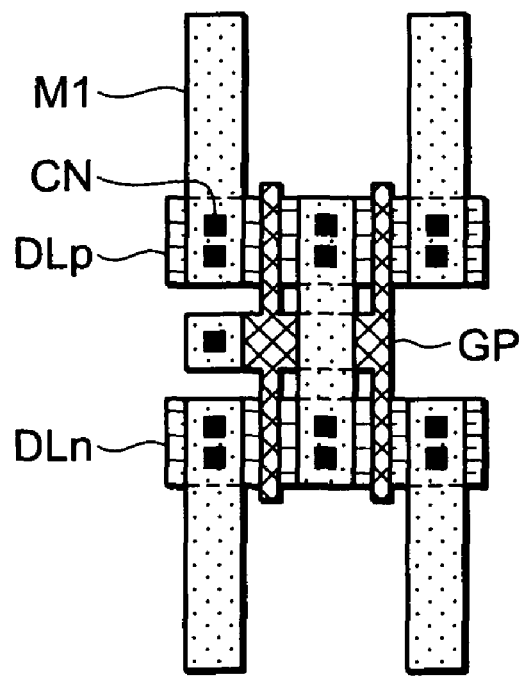
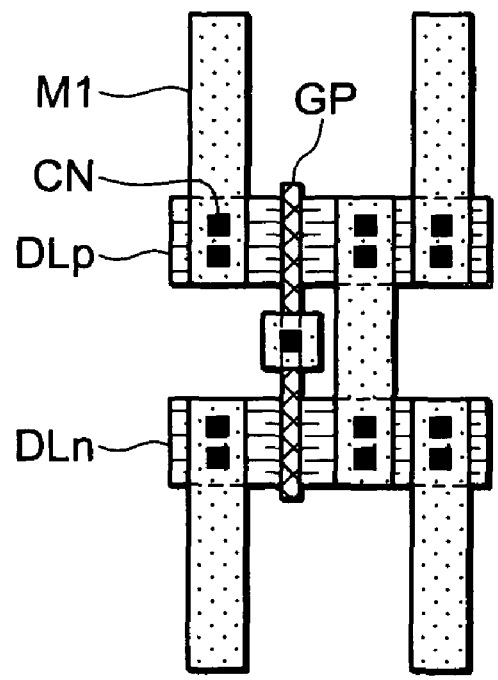

US 7,956,647 B2

CIRCUIT, APPARATUS AND METHOD OF TRANSMITTING SIGNAL

INCORPORATION BY REFERENCE

This application is based upon and claims the benefit of priority from Japanese patent application No. 2008-039792, filed on Feb. 21, 2008, the disclosure of which is incorporated herein in its entirety by reference.

BACKGROUND OF THE INVENTION

1. Field of the Invention

This invention relates to a semiconductor integrated circuit containing a signal circuit for transmitting signal.

2. Description of Related Art

A clock signal circuit outputs an output clock signal from an output terminal according to an input clock signal which is inputted from an input terminal. The clock signal circuit is described in a patent document 1. The clock signal circuit includes an adjust element for adjusting a delay. The delay corresponds to a time that the output clock signal is delayed relative to the input clock signal. The adjust element includes a connector unit for connecting a delay element (e.g., inverter circuit) to a wiring which transmits the clock signal.

[Patent Document 1] Japanese Unexamined Patent Application Publication No. 2001-230324

Therefore, during the semiconductor integrated circuit layout process, the delay may be adjusted just by replacing the adjust element without making other changes in the layout.

SUMMARY OF THE INVENTION

According to one exemplary aspect of the present invention, a circuit includes a first wiring to transmit a first signal, an alteration element to adjust a delay amount being added to the first wiring, and a shield element to shield the alteration element from a second wiring, the second wiring transmitting a second signal.

According to another exemplary aspect of the present invention, an apparatus includes a first wiring to transmit a first signal, an alteration element to adjust a delay amount being added to the first wiring, and a shield element to shield the alteration element from a second wiring, the second wiring transmitting a second signal.

According to another exemplary aspect of the present invention, an apparatus for laying out a circuit includes the circuit which includes a first wiring to transmit a first signal, an alteration element to adjust a delay amount being added to the first wiring, and a shield element to shield the alteration element from a second wiring, the second wiring transmitting a second signal.

According to another exemplary aspect of the present invention, a circuit block for designing a circuit includes a first wiring to transmit a first signal, an alteration element to adjust a delay amount being added to the first wiring, and a shield element to shield the alteration element from a second wiring, the second wiring transmitting a second signal.

BRIEF DESCRIPTION OF THE DRAWINGS

Other exemplary aspects and advantages of the invention will be made more apparent by the following detailed description and the accompanying drawings, wherein:

FIG. 10 is a drawing showing a circuit diagram and an equivalent circuit for a portion of a clock signal circuit of a variation of the invention.

DETAILED DESCRIPTION OF THE EXEMPLARY EMBODIMENT

In the related art disclosed in patent document 1, when the adjust element is modified, an electrically coupled state (for example, a static capacitance between an external wiring and the adjust element) between the adjust element and the external wiring may change. The external wiring is other than the clock signal circuit. The external wiring transmits data signals other than the clock signal. Therefore, an actual delay may be different from an estimated delay which is estimated in the layout (design) phase. For the difference between the actual delay and the estimated delay, it is required to estimate the delay once again after modifying the adjust element. In other words, the related art has the problem that adjusting the delay requires excessive time and trouble.

In the present invention, when a circuit is modified for adjusting the delay, the change of the estimated delay caused by the external wiring may be avoided.

1. First Exemplary Embodiment

Figure 1:
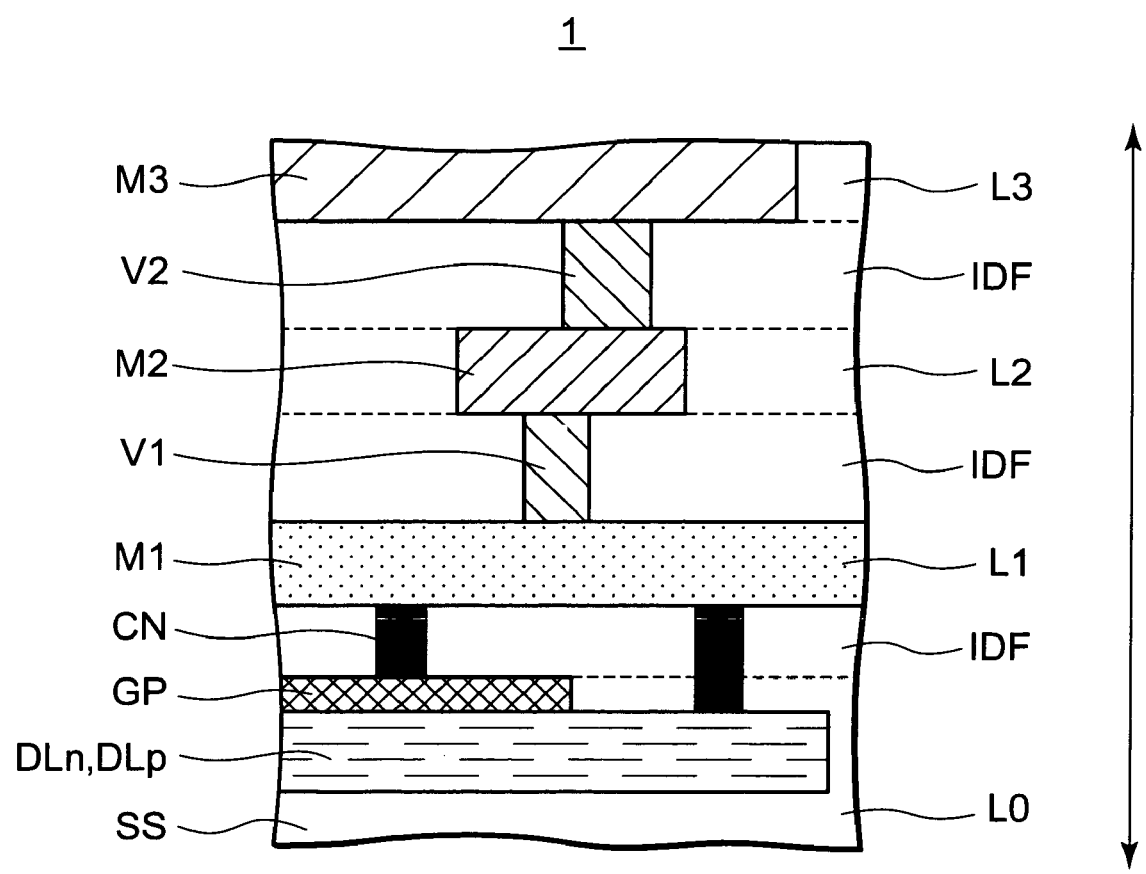
FIG. 1 is a cross sectional view of the semiconductor integrated circuit of a first exemplary embodiment.

A semiconductor integrated circuit 1 of the first exemplary embodiment includes a multi-layer structure formed as a lamination of multiple flat layers, as shown in FIG. 1. The multiple layers include a semiconductor substrate layer L0, and multiple (three in this example) wiring layers (a first wiring layer L1, a second wiring layer L2, and a third wiring layer L3) as shown in FIG. 1. An interlayer dielectric film (IDF), which is formed from an insulating material (e.g., a silicon dioxide), may be formed between the two adjacent layers.

The semiconductor substrate layer L0 contains a silicon substrate SS, an N-type diffusion layer DLn, a P-type diffusion layer DLp, a gate polysilicon GP, as well as source and drain electrodes and a gate oxidized film (not shown in FIG. 1). These layers in the semiconductor substrate layer L0 further contain CMOS (Complementary Metal Oxide Semiconductor) transistors, as well as circuit components such as resistors and diodes (not shown in FIG. 1).

The first wiring layer L1 includes the metallic wiring M1 (e.g., copper, aluminum, etc.). The second wiring layer L2 also includes wiring M2 made from metal. The third wiring layer L3 also includes wiring M3 made from metal.

A contact section CN is formed on the interlayer dielectric film (IDF) interposed between the semiconductor substrate layer L0 and the first wiring layer L1. The contact section CN is made from metal and connects the wiring M1 with the gate polysilicon GP, the N-type diffusion layer DLn or the P-type diffusion layer DLp.

A via section V1 is also formed on the interlayer dielectric film (IDF) interposed between the first wiring layer L1 and the second wiring layer L2. The via section V1 is made from metal and connects the wiring M1 with the wiring M2. A via section V2 is formed on the interlayer dielectric film (IDF) interposed between the second wiring layer L2 and the third wiring layer L3. The via section V2 is made from metal and connects the wiring M2 with the wiring M3.

Figure 2:
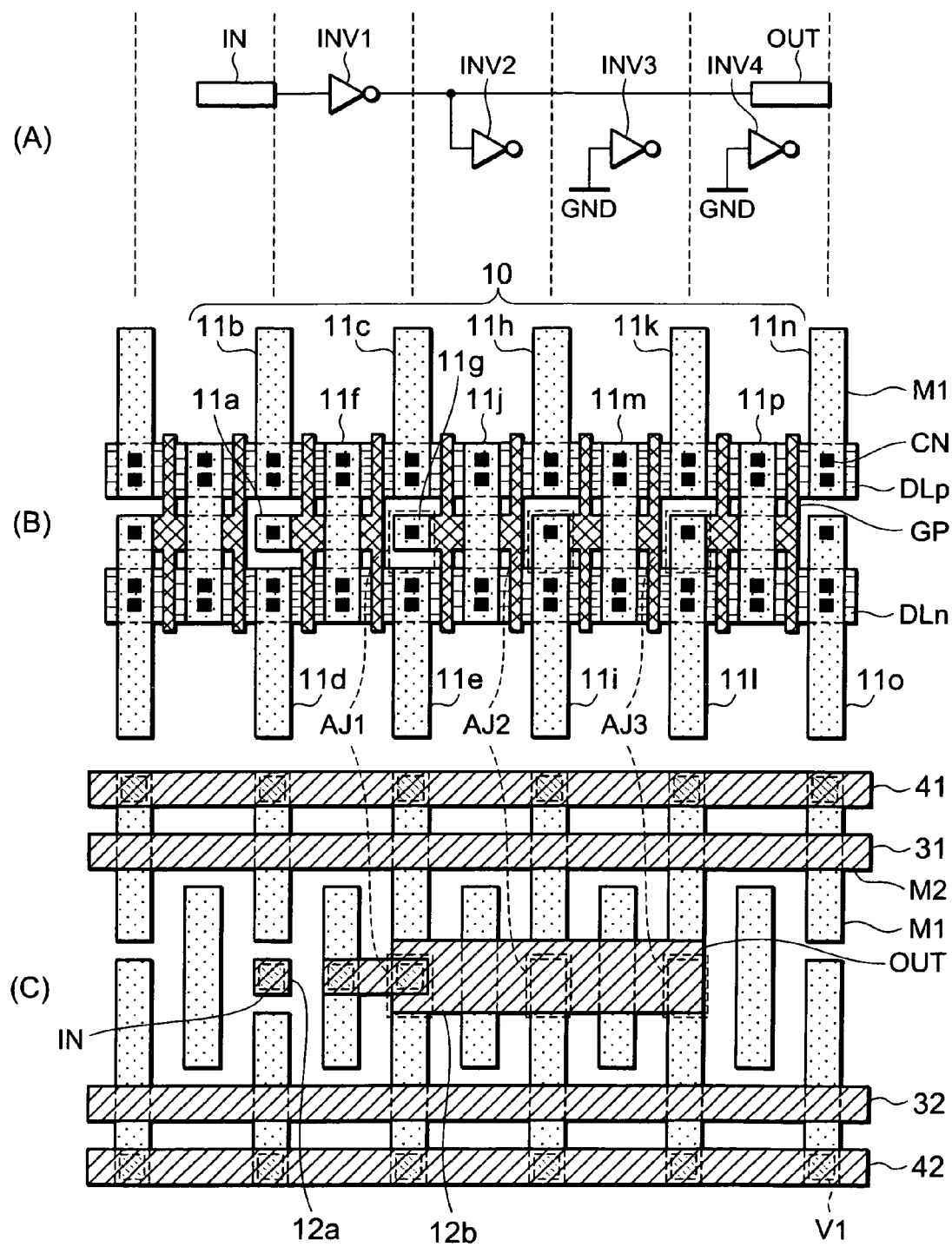
FIG. 2 is a drawing showing a circuit diagram and an equivalent circuit for a clock signal circuit of the semiconductor integrated circuit shown in FIG. 1.

The semiconductor integrated circuit 1 further includes a clock signal circuit (signal circuit) 10, data signal wiring (external wiring) 31, 32, a power supply voltage wiring 41, and a ground wire 42, as shown in FIG. 2. The data signal wiring 31, 32 transmit a data signal other than the clock signal.

The clock signal circuit 10 includes wirings 11a-11p which are formed on the first wiring layer L1, and wires 12a, 12b which are formed on the second wiring layer L2. The wiring 12a is the input terminal (IN) for the clock signal circuit 10. The wiring 12b is the output terminal (OUT) for the clock signal circuit 10.

As an equivalent circuit shown in portion (A) of FIG. 2, the clock signal circuit 10 includes an input terminal IN, an output terminal OUT, and the inverters (CMOS inverter) INV1-INV4. In this equivalent circuit, the inverters INV1-INV4 are expressed by a pair of two inverters connected in parallel. The clock signal circuit 10 therefore includes eight inverters in this example. The other equivalent circuits described hereafter are the same. The respective inverters INV2-inverters INV4 make up the delay adjuster circuit device (e.g., inverter).

Portion (B) of FIG. 2 expresses the wiring M1 formed on the first wiring layer L1, the contact section CN, the gate polysilicon GP, the P-type diffusion layer DLp, and the N-type diffusion layer DLn of the clock signal circuit 10. In the portion (B) of FIG. 2, these elements of the clock signal circuit 10 are viewed from a substantially perpendicular direction with respect to the semiconductor wiring layer L0.

Portion (C) of FIG. 2 expresses the wiring M2 formed on the second wiring layer L2, the via section V1, and the wiring M1 formed on the first wiring layer L1 of the clock signal circuit 10. In the portion (C) of FIG. 2, these elements of the clock signal circuit 10 are viewed from a substantially perpendicular direction with respect to the semiconductor wiring layer L0.

The wiring 12a is connected with the wiring M3 which is formed on the third wiring layer L3 through the via section V2. An input clock signal (input signal) is input to the wiring 12a from the wiring M3. The wiring 12b is connected with the wiring M3 which is formed on the third wiring layer L3 through the via section V2. The clock signal circuit 10 outputs an output clock signal (e.g., output signal) to the wiring M3 which is connected to the wiring 12b.

The gate polysilicon GP connected to the wiring 11a through the contact section CN forms the gate electrodes for the NMOS transistor and the PMOS transistor of the inverter INV1.

A source electrode of the PMOS transistor of the inverter INV1 is formed on the section of the P-type diffusion layer DLp which is connected to the wiring 11b through the contact section CN. Also, a source electrode of the PMOS transistor of the inverters INV1, INV2 is formed on the section of the P-type diffusion layer DLp which is connected to the wiring layer 11c through the contact section CN.

A source electrode of the NMOS transistor of the inverter INV1 is formed on a section of the N-type diffusion layer DLn which is connected to the wiring 11d through the contact section CN. Also, a source electrode of the NMOS transistor of the inverters INV1, INV2 is formed on a section of the N-type diffusion layer DLn which is connected to the wiring 11e through the contact section CN.

Drain electrodes of the PMOS and NMOS transistors of the inverter INV1 are formed on the section of the P-type diffusion layer DLp and N-type diffusion layer DLn which are connected to the wiring 11f through the contact section CN.

The gate polysilicon GP which is connected to the wiring 11g through the contact section CN forms the gate electrodes for the NMOS and PMOS transistors of the inverter INV2. The wiring 11g forms the input terminal of the inverter INV2.

The source electrodes of the PMOS transistors of the inverters INV2, INV3 are formed on the section of the P-type diffusion layer DLp which is connected to the wiring 11h through the contact section CN. The source electrodes of the NMOS transistors of the inverters INV2, INV3 are formed on the sections of the N-type diffusion layer DLn which is connected to the wiring 11i through the contact section CN. The drain electrodes of the PMOS and the NMOS transistors of the inverter INV2 are formed on the sections of the P-type diffusion layer DLp and the N-type diffusion layer DLn which are connected to the wiring 11j through the contact section CN.

The gate polysilicon GP which is connected to the wiring 11i through the contact section CN is the gate electrodes of the NMOS and PMOS transistors of the inverter INV3. The source electrodes of the PMOS transistors of the inverters INV3, INV4 are formed on a section of the P-type diffusion layer DLp which is connected to the wiring 11k through the contact section CN. The source electrodes of the NMOS transistors of the inverters INV3, INV4 are formed on the section of the N-type diffusion layer DLn which is connected to the wiring 11l through the contact section CN. The drain electrodes of the PMOS and NMOS transistors of the inverters INV3 are formed on the sections of the P-type diffusion layer DLp and the N-type diffusion layer DLn which are connected to the wiring 11m through the contact section CN.

The gate polysilicon GP which is connected to the wiring 11 through the contact section CN is a gate electrode of the NMOS and the PMOS transistors of the inverter INV4. The source electrodes of the PMOS transistors of the inverter INV4 are formed on the section of the P-type diffusion layer DLp which is connected to the wiring 11n through the contact section CN. The source electrodes of the NMOS transistors of the inverter INV4 are formed on the section of the N-type diffusion layer DLn which is connected to the wiring 11n through the contact section CN. The drain electrodes of the PMOS and the NMOS transistors of the inverter INV4 are formed on the sections of the P-type diffusion layer DLp and the N-type diffusion layer DLn which are connected to the wiring 11p through the contact section CN.

An alteration unit AJ1 includes a via section V1 for connecting the wiring 11g and the wiring 12b, and a section between the wiring 11g and the wiring 11e. The section between the wiring 11g and 11e is located on the first wiring layer L1.

An alteration unit AJ2 includes an interlayer dielectric (e.g., insulating) film (IDF) between the wiring 12b and a part of the wiring 11i, the part being located on the gate polysilicon GP, and a part of the wiring 11l between a portion of the wiring 11i being located on the N-type diffusion layer DLn and a portion of the wiring 11i being located on the gate polysilicon GP.

An alteration unit AJ3 includes an interlayer insulating film (IDF) between the wiring 12b and a part of the wiring 11l, the part being located on the gate polysilicon GP, and a part of the wiring 11l between a portion of the wiring 11l being located on the N-type diffusion layer DLn and a portion of the wiring 11l being located on the gate polysilicon GP.

The wiring 12b (e.g., shield element) is formed so that the wiring 12b covers the alteration units AJ1-AJ3. The wiring 12b covers the alteration units AJ1-AJ3 with respect to a direction which is substantially perpendicular to an intersection with the semiconductor substrate layer L0.

In other words, a portion of the wiring 12b is located between the data signal lines 31, 32 and the alteration units AJ1-AJ3. A width of the wiring 12b is larger than a width of other wirings (data signal lines 31, 32, power voltage line 41 and ground wire 42).

The wirings 11b, 11c, 11h, 11k, and 11n are connected to the power supply voltage wire 41 through the via section V1. The power supply voltage wire 41 is connected to the power supply. A voltage potential of the power supply voltage wire 41 is set to the supply voltage (VDD [V]) which is applied to the clock signal circuit 10.

The wirings 11d, 11e, 11i, 11l, and 11o are connected to the ground wire 42 through the via section V1. A voltage potential of the ground wire 42 is set to ground potential (0 [V]).

The wiring 12a is connected to the wire 11a (i.e., the gate electrode of the inverter INV1) through the via section V1. The wiring 11f (i.e., the drain electrode of inverter INV1) is connected to the wiring 12b through the via section V1.

The wiring 12a and the wiring 12b may be configured as an input/output wiring.

The wiring 12b (the input/output wiring) is connected to the wiring 11g (i.e., the input terminal of the inverter INV2) through the via section V1.

In the clock signal circuit 10, the inverter INV2 is connected to the input/output wiring 12b. A wiring capacitance of the input/output wiring 12b becomes larger because of a gate capacitance (e.g., a static capacitance between the gate electrode and source electrode or the drain electrode) of the inverter INV2.

In other words, the wiring capacitance becomes larger compared to when the inverter INV2 is not connected to the input/output line 12b. Therefore, the delay becomes longer than when the inverter INV2 is not connected to the input/output line 12b. The delay may mean that the output clock signal is delayed relative to the input clock signal.

The data signal wirings 31, 32 are wiring for transmitting the data signals. These data signal wirings 31, 32 are separated by a distance substantially equal to the (maximum) wiring width of input/output wiring 12b from the input/output line 12b.

The delay in the clock signal circuit 10 may change when the alteration units AJ1-AJ3 are modified.

Figure 3:
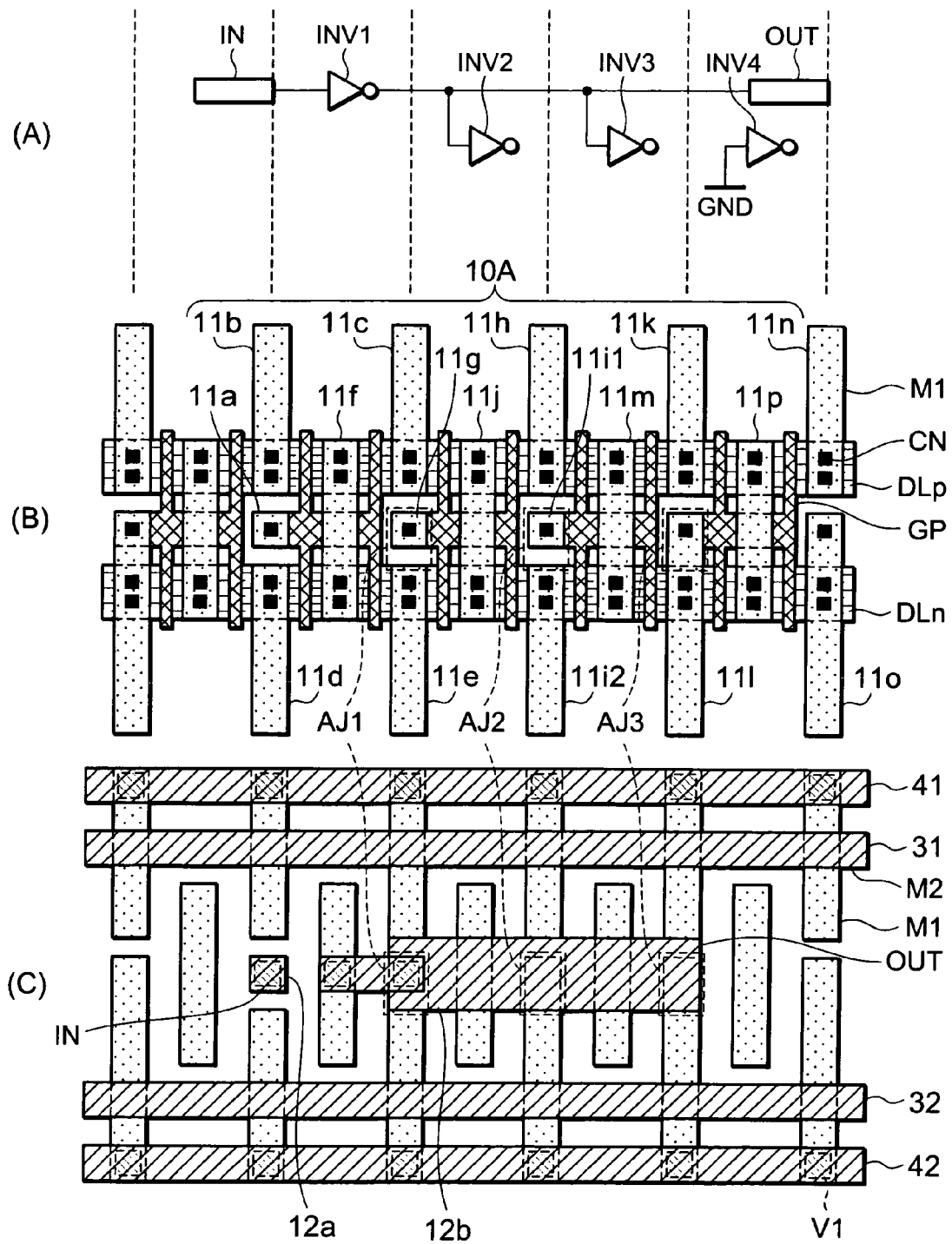
FIG. 3 is another drawing showing a circuit diagram and an equivalent circuit for the clock signal circuit of the semiconductor integrated circuit shown in FIG. 1.

For example, the clock signal circuit 10A of FIG. 3 is the circuit resulting from modifying the alteration unit AJ2.

Instead of the wiring 11i of clock signal circuit 10 of FIG. 2, the clock signal circuit 10A of FIG. 3 includes the wirings 11i1, 11i2 which are extracted from the wiring 11i of a portion between a section of the wiring 11i being located on the N-type diffusion layer DLn and a section of the wiring 11i being located on the gate polysilicon GP. The wiring 11i1 is the input terminal of the inverter INV3.

In other words, the wiring 11i1 does not connect to the wiring 11i2. The wiring 11i2 connects to the ground wire 42. The wiring 11i1 connects to the wiring 12b through the via section V1.

The input/output wiring 12b connects to the inverter INV3 in this clock signal circuit 10A.

Compared to the clock signal circuit 10, the wiring capacitance (e.g., a static capacitance between the input/output wiring 12b and the other conductors) of the input/output wiring 12b becomes larger because of the gate capacitance of the inverter INV3. Therefore, the delay becomes longer than that of the clock signal circuit 10.

The more irregular the pattern contour of the gate polysilicon GP, the N-type diffusion layer DLn and the P-type diffusion layer DLp, the more difficult it becomes to form the gate polysilicon GP, the N-type diffusion layer DLn and the P-type diffusion layer DLp in a high accuracy. On the other hand, changing the shape of the wiring M1 in the first wiring layer L1, and adding or eliminating the via section V1 is relatively easy.

The problem of excessive production variations appearing during the manufacture of the semiconductor integrated circuit 1 may be prevented by modifying the shape of the wiring M1 in the first wiring layer L1 and by adding or eliminating the via section V1.

Multiple clock signal circuits with different delays may be configured by modifying the alteration units AJ1-AJ3 of clock signal circuit 10, the same as for the clock signal circuit 10A.

When the inverter INV4 is connected to the input/output wiring 12b by modifying the alteration unit AJ3 of clock signal circuit 10A, the delay become larger. On the other hand, when the inverter INV2 is disconnected from the input/output line 12b by modifying the alteration unit AJ1, the delay becomes smaller.

In other words, the delay may be adjusted just by modifying the alteration units AJ1-AJ3 during the semiconductor integrated circuit design (layout) process without other layout changes.

In the clock signal circuits 10 and 10A, the input/output wiring 12b serving as the shield element is located between the alteration units AJ1-AJ3 and the external wiring (data signal wiring) 31, 32. The input/output wiring 12b in this way shields the alteration units AJ1-AJ3 from the external wirings 31, 32. Therefore a fluctuation in an electrically coupled state (e.g., a fluctuation in the static capacitance between the alteration units AJ1-AJ3 and the external wirings 31, 32) between the external wirings 31, 32 and the alteration units AJ1-AJ3 caused by modification of the alteration units AJ1-AJ3 may be reduced. The actual delay may become more closely approximate to the estimated delay.

By using the clock signal circuits 10, 10A, the delay may be adjusted with high accuracy by just modifying the alteration units AJ1-AJ3 during the semiconductor integrated circuit design (e.g., layout) process without other layout changes. In other words, a fluctuation of the delay which is caused by the external wirings 31, 32 when the signal circuit was replaced in order to adjust the delay may be avoided. Thus, adjusting the delay requires less time and trouble.

The above-mentioned structure of the clock signal circuit 10 and 10A also reduces the changes in signals being transmitted by the external wirings 31, 32, the changes in signals being caused by changes in the electrically-coupled state.

The above-mentioned structure of the clock signal circuit 10 and 10A prevents the external wirings 31, 32 from being located at positions where the input/output line 12b is formed. The distance (e.g., minimum distance) between the external wirings 31, 32 and the alteration units AJ1-AJ3 may become longer. Consequently, the fluctuations in the electrically-coupled state between the external wirings 31, 32 and the alteration units AJ1-AJ3 being caused by modifying the alteration units AJ1-AJ3, may be reduced. The actual delay may be more closely approximate to the estimated delay.

In the first exemplary embodiment, the data signal lines 31, 32, and the power supply voltage wiring 41, and the ground wire 42 may have substantially the same wiring width as the maximum wiring width of the input/output wiring 12b.

2. Second Exemplary Embodiment

The semiconductor integrated circuit of the second exemplary embodiment of this invention is described hereinbelow. The semiconductor integrated circuit of the second exemplary embodiment differs from the semiconductor integrated circuit of the first exemplary embodiment in that a shield wiring is installed between the alteration units AJ1-AJ3 and the external wirings 31, 32 in the second wiring layer L2. The following description focuses on this differing point.

Figure 4:
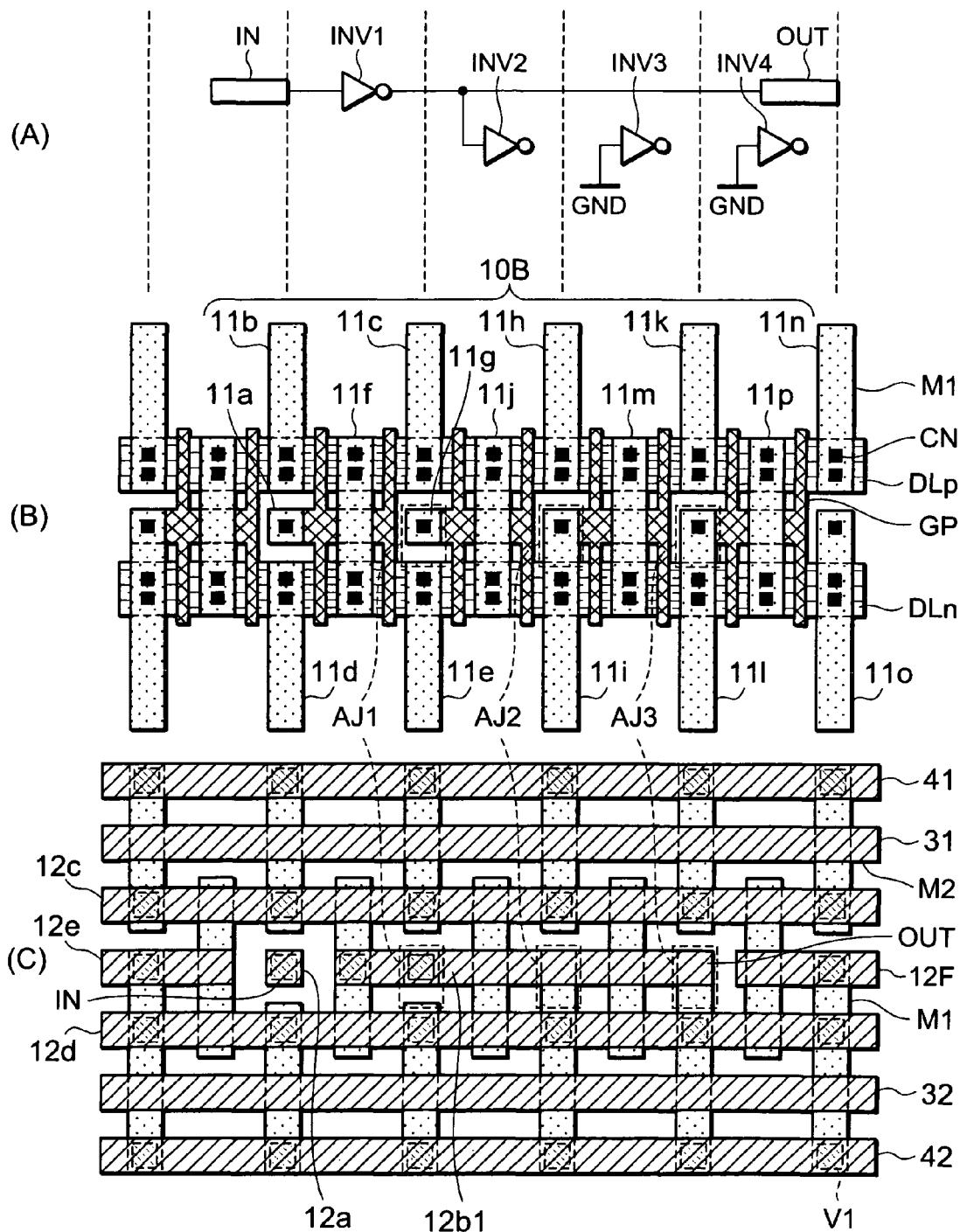
FIG. 4 is another drawing showing a circuit diagram and an equivalent circuit for a clock signal circuit of a second exemplary embodiment.

As shown in portion (C) of FIG. 4, the clock signal circuit 10B includes shield wirings 12c-12f which are formed on the second wiring layer L2, and the input/output wiring 12b1 instead of the input/output wiring 12b.

The input/output wiring 12b1 has substantially the same wiring width as the data signal wiring 31, 32, the power supply voltage wiring 41 and the ground wire 42.

The shield wiring 12c (e.g., a first shield wiring) extends substantially parallel to the input/output wiring 12b1 (e.g., along the input/output wiring 12b1). When viewed from a direction substantially perpendicular with respect to the semiconductor substrate L0, the shield wiring 12c is installed between the data signal wiring 31 and the alteration units AJ1-AJ3. The shield wiring 12c is isolated respectively from the data signal wiring 31 and the input/output wiring 12b1 by a distance substantially equal to the wiring width (e.g., a pitch length) of the input/output wiring 12b1.

The shield wiring 12c connects to the power supply voltage wiring 41 through a via section V1. An amount of electrical current which is flowing in the power supply voltage wiring 41 may be reduced. The voltage drop occurring due to the wiring resistance in the power supply voltage wiring 41 may be lower so that the power supply voltage (potential) in power supply voltage wiring 41 may be securely maintained at a reliable level.

The shield wiring 12d (e.g., a second shield wiring) extends substantially parallel to the input/output wiring 12b1 (e.g., along the input/output wiring 12b1). When viewed from a direction substantially perpendicular with respect to the semiconductor substrate L0, the shield wiring 12d is installed between the data signal wiring 32 and the alteration units AJ1-AJ3. The shield wiring 12d is isolated respectively from the data signal wiring 32 and the input/output wiring 12b1 by a distance substantially equal to the wiring width (e.g., pitch length) of the input/output wiring 12b1. Each of the shield wires 12d-12f is connected to the ground wiring 42 through the contact section V1.

In other words, the shield wiring 12c and the shield wiring 12d are installed so as to enclose the input/output wiring 12b1 from both sides.

In the clock signal circuit 10B as shown in portion (A) of FIG. 4, only the INV2 among the inverters INV2-INV4 is connected to the input/output wiring 12b1.

However, the delay in the clock signal circuit 10B is replaced the same as in the first exemplary embodiment, when the alteration units AJ1-AJ3 are replaced.

Figure 5:
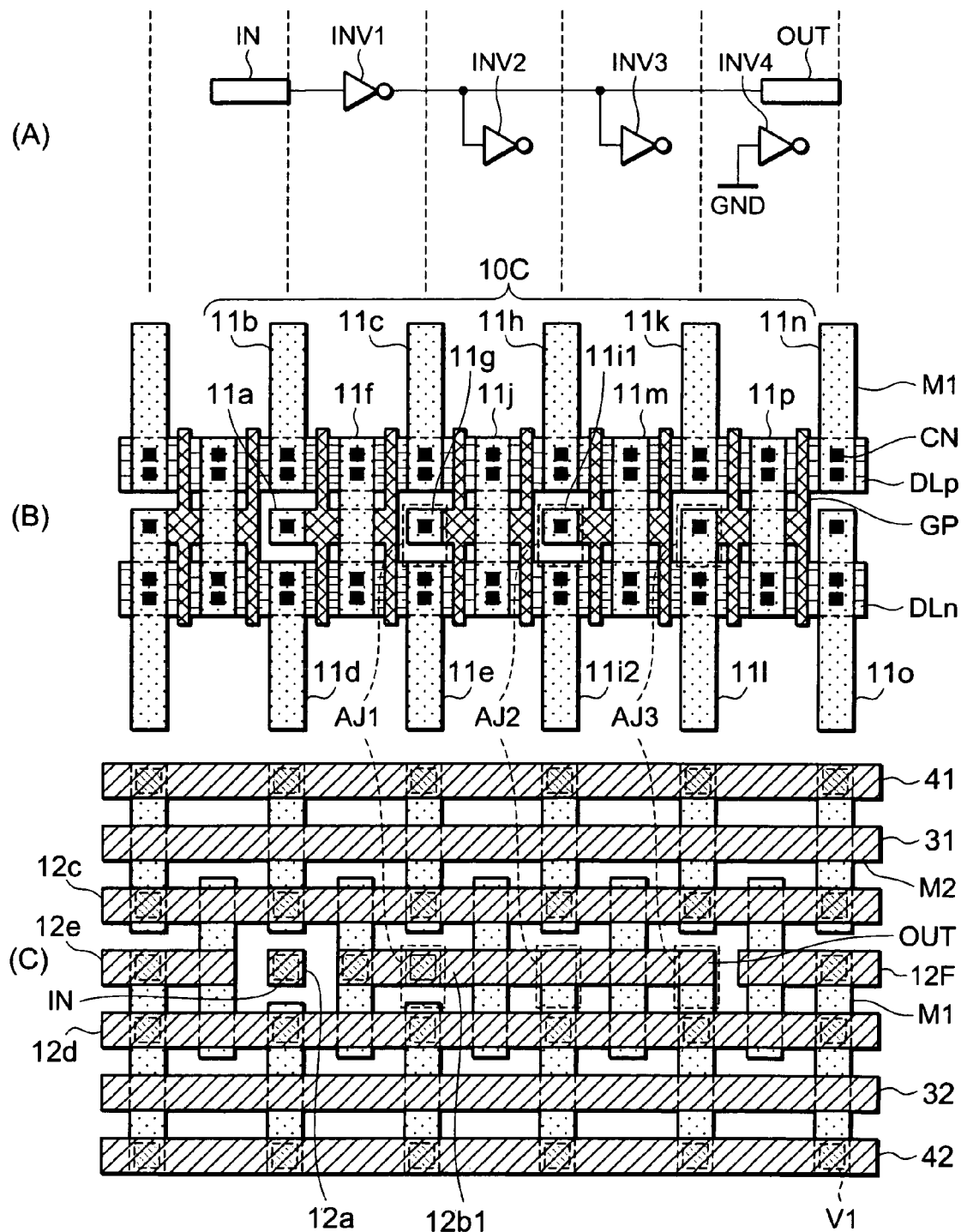
FIG. 5 is another drawing showing a circuit diagram and the equivalent circuit for the clock signal circuit of the second exemplary embodiment.

As shown for example in FIG. 5, the clock signal circuit 10C is a circuit resulting from modifying the alteration unit AJ2 of the clock signal circuit 10B.

Instead of the wiring 11i of clock signal circuit 10B, the clock signal circuit 10C includes the wirings 11i1, 11i2 which are removed from the wiring 11i of a portion being located between a section on the N-type diffusion layer DLn and a section on the gate polysilicon GP. The wiring 11i1 is the input terminal of the inverter INV3.

In other words, the wiring 11i1 does not connect to the wiring 11i2. The wiring 11i2 connects to the ground wiring 42. The wiring 11i1 further connects to the wiring 12b1 through the via section V1.

In other words, the input/output wiring 12b1 connects to the inverter INV3 in the clock signal circuit 10C.

Compared to the clock signal circuit 10B, the wiring capacitance of the input/output wiring 12b1 becomes larger because of the gate capacitance of the inverter INV3. Therefore, the delay becomes longer than that of the clock signal circuit 10B.

Multiple clock signal circuits with different delays may be configured in the same way by modifying the alteration units AJ1-AJ3 of clock signal circuit 10B.

In a clock signal circuit in which the inverter INV4 is connected to the input/output wiring 12b1, the delay becomes longer than in the clock signal circuit 10C. On the other hand, in a clock signal circuit in which the inverter INV2 is disconnected from the input/output line 12b1 by modifying the alteration unit AJ1 of the clock signal circuit 10B, the delay becomes smaller than the clock signal circuit 10B.

The delay may be adjusted just by modifying the alteration units AJ1-AJ3 during the semiconductor integrated circuit design (e.g., layout) process without other layout changes.

In the clock signal circuits 10B and 10C, the shield wirings 12c, 12d are installed as shield elements between the alteration units AJ1-AJ3 and the external wirings 31, 32. The shield wirings 12c, 12d shield the alteration units AJ1-AJ3 from the external wirings 31, 32. A fluctuation in the electrically-coupled state (for example, fluctuations in the static capacitance between the external wirings 31, 32 and the alteration units AJ1-AJ3) between the external wirings 31, 32 and the alteration units AJ1-AJ3 due to modifying the alteration units AJ1-AJ3 may be reduced. The actual delay may become more closely approximate to the estimated delay.

By using the clock signal circuits 10B and 10C, the delay may be adjusted with high accuracy just by modifying the alteration units AJ1-AJ3 during the semiconductor integrated circuit design (e.g., layout) process without other layout changes. Thus, adjusting the delay requires less time and trouble.

The above-mentioned structure also reduces the fluctuation, which is caused by fluctuations in the electrically coupled state, in signals transmitted by the external wirings 31, 32.

The above-mentioned structure prevents the external wirings 31, 32 from being installed at positions where the shield lines 12c, 12d are formed. The distance (e.g., a minimum distance) between the external wirings 31, 32 and the alteration units AJ1-AJ3 may become longer. Consequently, the fluctuations, which are caused by replacing the alteration units AJ1-AJ3, in the electrically-coupled state between the external wiring 31, 32 and the alteration units AJ1-AJ3, may be reduced to a lower level. The actual delay may be more closely approximate to the estimated delay.

The shield wirings 12c, 12d are installed so as to enclose the input/output wiring 12b1 from both sides. Consequently, the fluctuation, which is caused by modifying the alteration units AJ1-AJ3, in the electrical coupling between the alteration units AJ1-AJ3 and the external wirings 31, 32, may be reduced to a lower level than when using either the shield wiring 12c or the shield wiring 12d. The actual delay may be more closely approximate to the estimated delay.

In the above example, the alteration unit AJ1 may connect the inverter INV2 to the input/output wire 12b1 substantially parallel with the inverter INV1.

Figure 6:
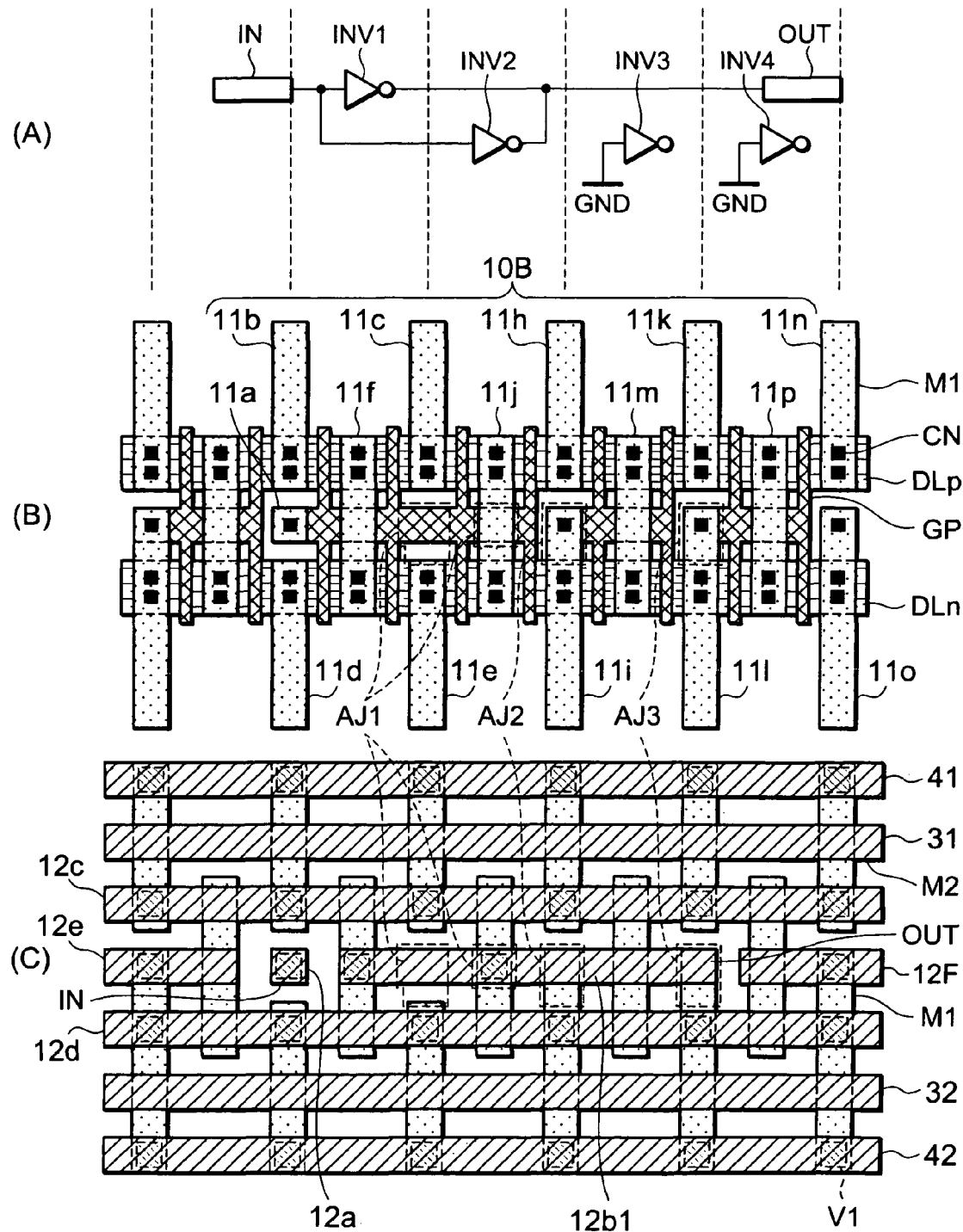
FIG. 6 is yet another drawing showing a circuit diagram and an equivalent circuit for the clock signal circuit of the second exemplary embodiment.

In the case where the inverter INV2 is connected to the input/output wire 12b1, the connector unit as shown in FIG. 6 includes a via section for connecting the input/output wiring 12b1 and an output terminal of the inverter INV2 at a position farther on the "OUT" side (e.g., "OUT" is an output terminal of the clock signal circuit 10B shown in FIG. 6) than an output terminal of the inverter INV1. The connector unit also includes a gate polysilicon GP for connecting the gate electrode (i.e., the input terminal of inverter INV1) of the inverter INV1 with the gate electrode (namely, the input terminal of inverter INV2) of the inverter INV2.

When the inverter INV2 is connected to the input/output wiring 12b1 substantially parallel with the inverter INV1, a load on each of the inverters may be reduced as compared to the case where the inverter INV2 is not connected to the input/output wiring 12b1. Therefore, the delay may be small.

The delay may be adjusted by modifying the alteration unit AJ1.

The second exemplary embodiment renders the same effects as the above-described clock signal circuits 10B, 10C.

3. Third Exemplary Embodiment

The semiconductor integrated circuit of the third exemplary embodiment of the invention is described. The semiconductor integrated circuit of the third exemplary embodiment differs from the semiconductor integrated circuit of the first or second exemplary embodiments in that the inverter is different from the inverters INV2-INV4 of the first or second exemplary embodiments used as the delay adjuster circuit device (e.g., inverter). The following description focuses on that differing point.

Figure 7:
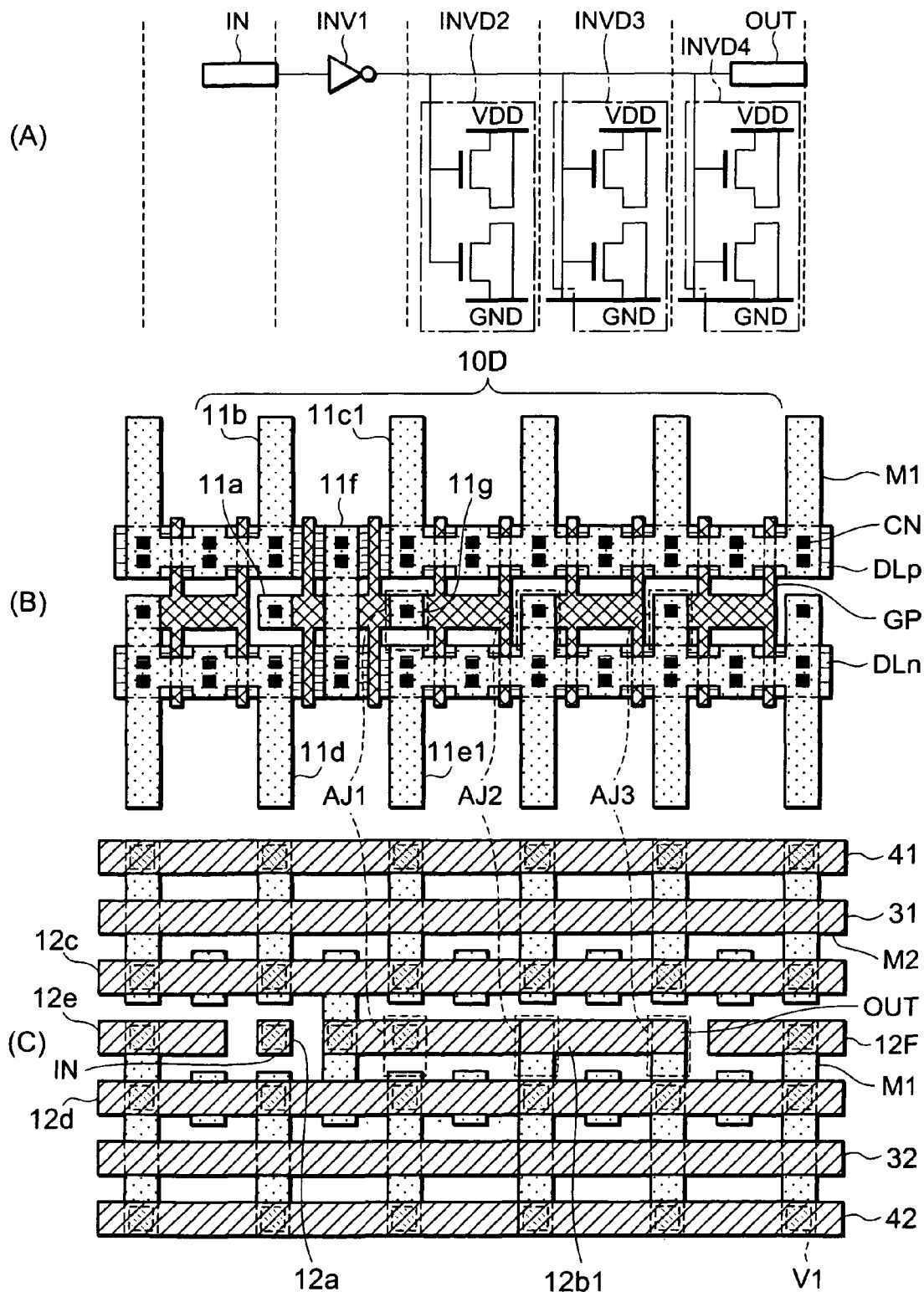
FIG. 7 is a drawing showing a circuit diagram and an equivalent circuit for a clock signal circuit of a third exemplary embodiment.

As shown in FIG. 7, a clock signal circuit 10D includes inverters INVD2-INVD4, instead of the INV2-INV4. In the inverters INVD2-INVD4, a source electrode of the PMOS transistor is connected with a drain electrode of the PMOS transistor, and a source electrode of the NMOS transistor is connected with a drain electrode of the NMOS transistor. And, the drain electrode of the PMOS transistor and the drain electrode of the NMOS transistor are closed in the inverters INVD2-INVD4.

As shown in portion (B) of FIG. 7, the clock signal circuit 10D includes wirings 11c1, 11e1, instead of the wirings 11c, 11e, and 11h-11p.

The wiring 11c1 connects all of the source electrodes and drain electrodes of the respective PMOS transistors of the inverters INVD2-INVD4. The wiring 11c1 is connected to the power supply voltage wiring 41 through the via section V1.

The wiring 11e1 connects all of the source electrodes and drain electrodes of the respective NMOS transistors of the inverters INVD2-INVD4. The wiring 11e1 connects all of the gate electrodes and source electrodes of the respective NMOS transistors of the inverters INVD3, INVD4. The wiring 11e1 is connected to the ground wire 42 through the via section V1.

The clock signal circuit 16D configured as described above also renders a similar effect as the first and second exemplary embodiments. In other words, the shield wirings 12c, 12d shield the alteration units AJ1-AJ3 from the external wirings 31, 32. The fluctuations, which are caused by modifying the alteration units AJ1-AJ3, in the electrically coupled state between the alteration units AJ1-AJ3 and the external wirings 31, 32 may be reduced. The actual delay may be more closely approximate to the estimated delay.

Further, the clock signal circuit 10D may cut off the off-leakage current which is flowing in sequence in the PMOS source electrode, the PMOS drain electrode, the NMOS drain electrode, and the NMOS source electrode. Therefore, the clock signal circuit 10D may reduce power consumption.

5. Fourth Exemplary Embodiment

The semiconductor integrated circuit of a fourth exemplary embodiment of the invention differs from the semiconductor integrated circuit of the third exemplary embodiment in that the inverter is different from the inverters INVD2-INVD4 of the third exemplary embodiment used as the delay adjuster circuit device (e.g., inverter). The following description focuses on that differing point.

Figure 8:
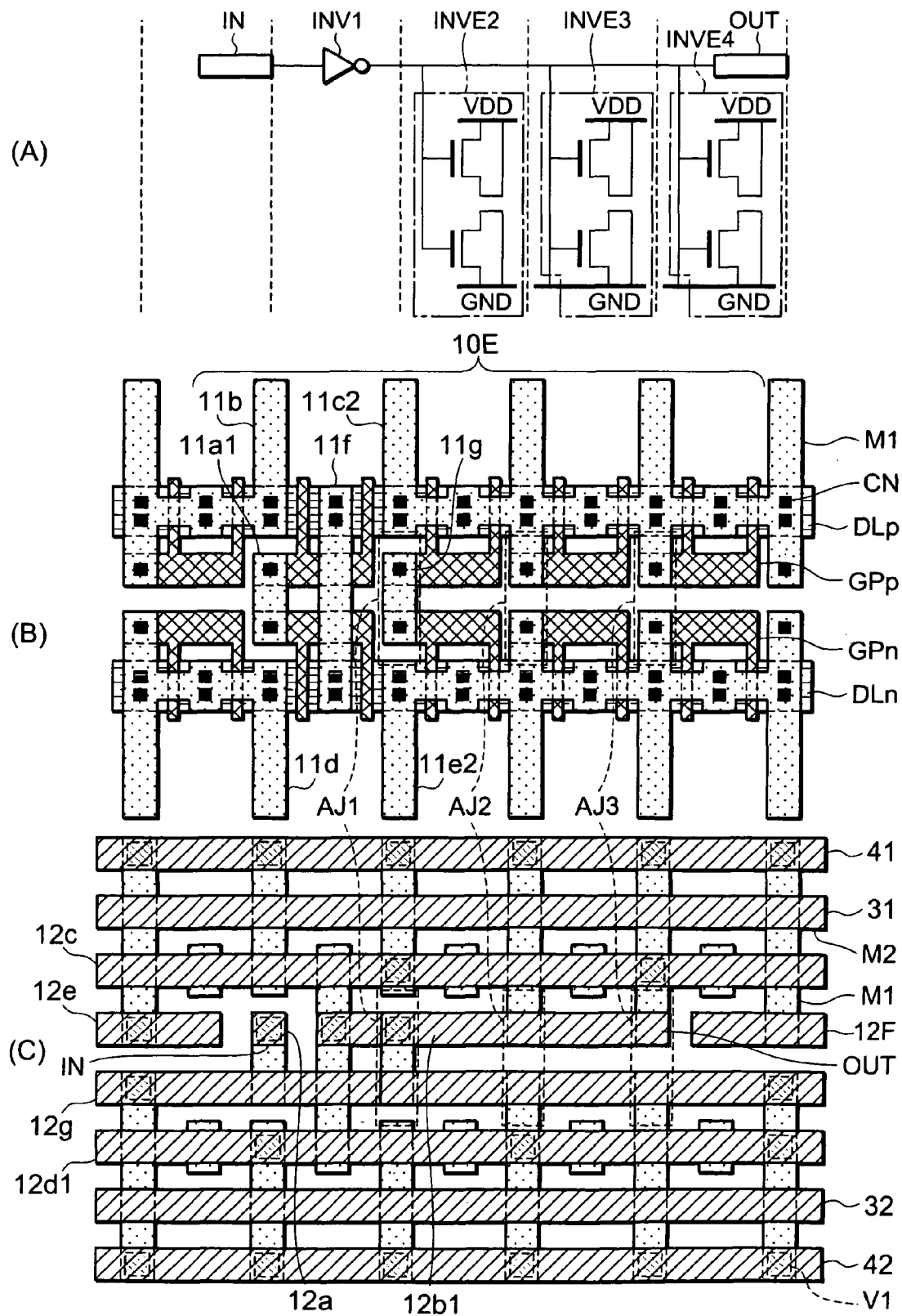
FIG. 8 is a drawing showing a circuit diagram and an equivalent circuit for a clock signal circuit of a fourth exemplary embodiment.

As shown in FIG. 8, the clock signal circuit 10E includes inverters INVE2-INVE4, instead of the inverters INVD2-INVD4.

In the inverters INVE3, INVE4 which are not connected to the input/output line 12b1, a gate electrode of the PMOS transistor is connected with a source electrode of the PMOS transistor, and a gate electrode of the NMOS transistor is connected with a source electrode of the NMOS transistor.

As shown in portion (B) of FIG. 8, the clock signal circuit 10E includes a first gate polysilicon GPp and a second gate polysilicon GPn, instead of gate polysilicon GP, and the wirings 11a1, 11c2, 11e2, 11g1, instead of the wirings 11a, 11c1, 11e1, and 11g.

The first gate polysilicon GPp and the second gate polysilicon GPn are separated from each other by a predetermined distance. The first gate polysilicon GPp is configured as a gate electrode of the PMOS transistor of the inverters INV1, INVE2-INVE4. The second gate polysilicon GPn is configured as a gate electrode of the inverters INV1, INVE2-INVE4.

The wiring 11a1 connects a first gate polysilicon GPp of the inverter INV1 with a second gate polysilicon GPn of the inverter INV1.

The wiring 11c2 connects all of the source electrodes and drain electrodes of the respective PMOS transistor of the inverters INVE2-INVE4. The wiring 11c2 connects all of the source electrodes and gate electrodes of the respective PMOS transistor of the inverters INVE3, INVE4. The wiring 11c2 is connected to the power supply voltage 41 through the via section V1.

The wiring 11e2 connects all the source electrodes and drain electrodes of the respective NMOS of the inverters INVE2-INVE4. The wiring 11e2 connects all the source electrodes and gate electrodes of the respective NMOS of the inverters INVE3, INVE4. This wiring 11e2 is connected to the ground wiring 42 through the via section V1.

The wiring 11g1 connects a second gate polysilicon GPn of the inverter INVE2 with a second gate polysilicon GPp of the inverter INVE2.

The alteration unit AJ1 includes a via section V1 which connects the wiring 12b with a section on the first gate polysilicon GPp of the wiring 11g1, a first section, a second section and a third section described below on the first wiring layer L1. The first, second and third sections are described below.

The first section is a portion between the wiring 11g1 and a section being located on the PMOS source electrodes of the inverter INVE2 of the wiring 11c2. The second section is a portion between the wiring 11g1 and a section being located on the NMOS source electrodes of the inverter INVE2 of the wiring 11e2. The third section is a portion between a section being located on the second gate polysilicon GPn of the wiring 11g1 and the section being located on the first gate polysilicon GPp of the wiring 11g1.

The alteration unit AJ2 includes an interlayer dielectric (insulating) film (IDF) on a portion between the input/output wiring 12b1 and a section being located on the first gate polysilicon GPp of the inverter INVE3 of the wiring 11c2. The alteration unit AJ2 includes a first section, a second section and a third section on the first wiring layer L1. The first, second and third sections are described below.

The first section is a portion between a section being located on the first gate polysilicon GPp of the inverter INVE3 of the wiring 11c2 and a section being located on the PMOS source electrodes of the inverter INVE3 of the wiring 11c2. The second section is a portion between a section being located on the second gate polysilicon GPn of the inverter INVE3 of the wiring 11e2 and a section being located on the NMOS source electrode of the inverter INV3 of the wiring 11e2. The third section is a portion between a section being located on the second gate polysilicon GPn of the inverter INVE3 of the wiring 11e2 and a section being located on the first gate polysilicon GPp of the inverter INVE3 of the wiring 11c2.

The alteration unit AJ3 includes an interlayer dielectric (insulating) film (IDF) between the input/output wiring 12b1 and a section being located on the first gate polysilicon GPp of the inverter INVE4 of the wiring 11c. The alteration unit AJ3 includes a first section, a second section and a third section.

The first section is a portion between a section being located on the first gate polysilicon GPp of the inverter INVE4 of the wiring 11c2 and a section being located on the PMOS source electrodes of the inverter INVE4 of the wiring 11c2. The second section is a portion between a section being located on the second gate polysilicon GPn of the inverter INVE4 of the wiring 11e2 and a section being located on the NMOS source electrode of the inverter INVE4 of the wiring 11e2. The third section is a portion between a section being located on the second gate polysilicon GPn of the inverter INVE4 of the wiring 11e2 and a section being located on the first gate polysilicon GPp of the inverter INVE4 of the wiring 11c2.

The wiring 12a, which forms the input terminal of the clock signal circuit 10E, is connected to the wiring 11a1. The input/output wiring 12b1, which forms the output terminal of the clock signal circuit 10E, is connected to the wiring 11f and the wiring 11g1.

The wiring 12a and the input/output wiring 12b1 are installed so as to overlap with a connecting section which connects the first gate polysilicon GPp and the wirings 11a1, 11c2, 11g1. The wiring 12a and the input/output wiring 12b1 overlap with respect to a substantially perpendicular to the semiconductor substrate layer L0.

The clock signal circuit 10E includes an installation-blocker wire 12g and a shield wiring 12d1, instead of the shield wiring 12d as the shield element.

The installation-blocker wire 12g extends substantially parallel to the input/output wire 12b1 (e.g., along the input/output wire 12b1). The installation-blocker wire 12g is separated by a distance substantially equal to the wiring width (e.g., pitch length) of the input/output wire 12b1, from the input/output wire 12b1.

The installation-blocker wire 12g is further installed so as to overlap with a connecting section which connects the second gate polysilicon GPn and the wirings 11a1, 11e2, 11g1. The wiring 12g overlaps with respect to a substantially perpendicular to the semiconductor substrate layer L0.

In other words, the installation-blocker wire 12g is installed so as to overlap with the alteration units AJ1-AJ3. The installation-blocker wire 12g overlaps with the alteration units AJ1-AJ3 with respect to a direction substantially perpendicular to the semiconductor substrate layer L0.

The shield wiring 12d1 extends substantially parallel to the input/output wire 12b1 (e.g., along the input/output wire 12b1). The shield wiring 12d1 is separated by a distance substantially equal to the wiring width (e.g., pitch length) of the wiring M2, from the installation-blocker wire 12g. When viewed from a direction substantially parallel with respect to the semiconductor substrate L0, the shield wiring 12d1 is installed between the alteration units AJ1-AJ3 and the data signal line 31. The shield wiring 12d1 is connected to the ground wiring 42.

In the clock signal circuit 10E, the INVE2 among the inverters INVE2-INVE4 is connected to the input/output wiring 12b1 as shown in portion (A) of FIG. 8.

By modifying the alteration units AJ1-AJ3, the delay of the clock signal circuit 10E changes.

Figure 9:
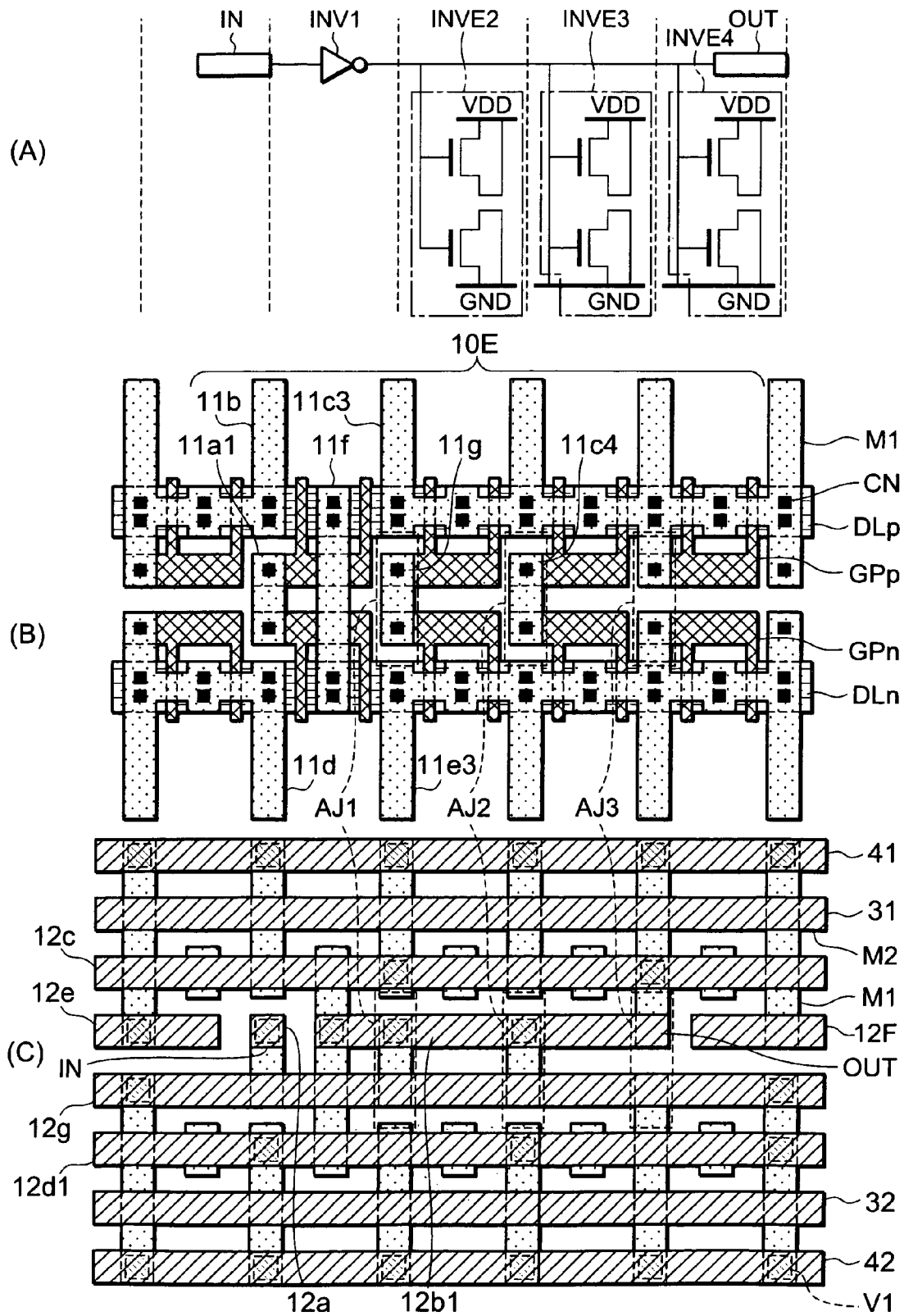
FIG. 9 is another drawing showing a circuit diagram and an equivalent circuit for the clock signal circuit of the fourth exemplary embodiment.

The clock signal circuit 10F for example is the circuit resulting from replacing the alteration unit AJ2 in the clock signal circuit 10E, as shown in FIG. 9.

The clock signal circuit 10F includes the wirings 11c3, 11c4 and 11e3, instead of the wirings 11c2, 11e2 of the clock signal circuit 10E.

The wiring 11c3 is the wiring which is extracted from the wiring 11c2 of a portion between a section being located on the first gate polysilicon GPp of the inverter INVE3 and a section being located on the PMOS source electrode of the inverter INVE3, and of a portion being located on the first gate polysilicon GPp of the inverter INVE3.

The wiring 11e3 is the wiring which is extracted from the wiring 11e2 of a portion between a section being located on the second gate polysilicon GPn of the inverter INVE3 and a section being located on the NMOS source electrode of the inverter INVE3, and of a portion being located on the second gate polysilicon GPn of the inverter INVE3.

The wiring 11c4 connects the first gate polysilicon GPp of the inverter INVE3 with the second gate polysilicon GPn of the inverter INVE3. The wiring 11c4 forms the input terminal of the inverter INVE3. The wiring 11c4 is connected to the input/output wiring 12b1 through the via section V1.

In this clock signal circuit 10F, the inverter INVE3 is connected to the input/output wiring 12b1.

The wiring capacitance of the input/output wiring 12b1 becomes large because of the gate capacitance of the inverter INVE3. The delay is larger.

In the same way, multiple clock signal circuits with different delays may be obtained by modifying the alteration units AJ1-AJ3 of clock signal circuit 10F.

The clock signal circuits 10E, 10F may obtain a similar advantage as that of the third exemplary embodiment.

Namely, the shield wirings 12c, 12d1 shield the alteration units AJ1-AJ3 from the external wirings 31, 32. The fluctuations, which are caused by replacing the alteration units AJ1-AJ3, in the electrically-coupled state between the external wirings 31, 32 and the alteration units AJ1-AJ3 may be reduced. The actual delay may be closely approximate to the estimated delay.

The off-leakage current which is flowing in sequence from the PMOS source electrode, the PMOS drain electrode, the NMOS drain electrode, and the NMOS source electrode may be shut off in the clock signal circuits 10E, 10F in the same way as the third exemplary embodiment. Consequently, the power consumption of the delay adjuster circuit device (e.g., inverter) may be reduced.

These clock signal circuits 10E, 10F may shut off both the gate leak current flowing between the NMOS gate electrodes and source electrodes, and the gate leak current flowing between the PMOS gate electrodes and source electrodes in delay adjuster circuit devices which are not connected to the input/output line 12b1 (namely, the inverters INVE3, INVE4 in the signal clock circuit 10E, or the inverter INVE4 in the clock signal circuit 10F). The power consumption of the delay adjuster circuit devices (e.g., inverters) may be reduced.

In the above-mentioned structure, the installation-blocker wire 12g is installed so as to overlap with the alteration units AJ1-AJ3 with respect to a direction substantially perpendicular to the semiconductor substrate layer L0.

Installation of external wirings 31, 32 other than the input/output wiring 12b1 on the alteration units AJ1-AJ3 may be prevented even in cases where the alteration units AJ1-AJ3 are installed over a comparatively wide range.

This invention is not limited to the above-mentioned exemplary embodiments. In the structure shown in portion (A) of FIG. 10 for example, one gate polysilicon GP is utilized to form two inverters connected substantially in parallel. However, in the structure shown in portion (B) of FIG. 10, one gate polysilicon GP may be utilized to form one inverter.

The delay adjuster circuit device in the above-mentioned exemplary embodiments is an inverter (e.g., gate capacitance of inverter) but may also be a device other than an inverter with capacitance, and for example may be wiring. Moreover in the above-mentioned exemplary embodiments, a shield element is installed in the second wiring layer L2, but may be installed in another wiring layer.

Further, in the signal circuits in each of the above exemplary embodiments, the clock signal was structured for input by an input clock signal serving as the input signal, and to output an output clock signal serving as the output signal. However, a data signal circuit may be used that is input with an input data signal serving as the input signal, and outputs an output data signal serving as the output signal.

Further, an apparatus for designing the clock signal circuit 10 of the present invention may be within a scope of the present invention.

Further, it is noted that Applicant's intent is to encompass equivalents of all claim elements, even if amended later during prosecution.

What is claimed is:

1. A circuit, comprising:
   a first wiring to transmit a first signal;
   an alteration element to adjust a delay amount being added to the first wiring; and
   a shield element to shield the alteration element from a second wiring, the second wiring transmitting a second signal,
   wherein the shield element and the alteration element are located at different layers of a substrate,
   wherein the shield element is located between the alteration element and the second wiring, and
   wherein the shield element is located at a location covering the alteration element.

2. The circuit according to claim 1, further comprising:
   a circuit element,
   wherein the alteration element alters a connection between the circuit element and the first wiring for adjusting the delay amount.

3. The circuit according to claim 2, wherein the circuit element comprises a CMOS inverter which includes a P-type MOS transistor and an N-type MOS transistor.

4. The circuit according to claim 3, wherein a source terminal of the P-type MOS transistor and a drain terminal of the P-type MOS transistor are connected to each other,
   wherein a source terminal of the N-type MOS transistor and a drain terminal of the N-type MOS transistor are connected to each other,
   wherein each of a drain terminal of the P-type MOS transistor and a drain terminal of the N-type MOS transistor is closed.

5. The circuit according to claim 4, wherein a gate terminal of the P-type MOS transistor and the source terminal of the P-type MOS transistor are connected to each other when the circuit element is disconnected from the first wiring, and
   wherein a gate terminal of the N-type MOS transistor and the source terminal of the N-type MOS transistor are connected to each other when the circuit element is disconnected from the first wiring.

6. The circuit according to claim 2, wherein the alteration element alters the connection between the circuit element and the first element within a shielding area of the shield element.

7. The circuit according to claim 2, wherein the alteration element comprises:
   a first connecting element to connect the circuit element to the first wiring; and
   a second connecting element to connect the circuit element to a third wiring,
   wherein the first and second connecting elements work alternately.

8. The circuit according to claim 7, wherein the first connecting element comprises a via hole,
   wherein a second connecting element comprises a wiring element,
   wherein a length of the wiring element is within a distance between the first wiring and the shield element.

9. The circuit according to claim 1, wherein the shield element is located so that the shield element prevents the second wiring from being layed-out at a location overlapping the alteration element.

10. The circuit according to claim 1, wherein the shield element is included in the first wiring.

11. The circuit according to claim 1,
    wherein the shield element is located at the location covering the alteration element with respect to a substantially perpendicular direction of the substrate.

12. The circuit according to claim 1, wherein the shield element comprises:
    a first shield element; and
    a second shield element,
    wherein the first and second shield elements are provided substantially parallel with respect to the first wiring, and
    wherein the first wiring and the alteration element are located between the first and second shield elements.

13. The circuit according to claim 1, wherein the shield element is connected to a voltage line which provides a voltage to the first wiring.

14. The circuit according to claim 1, wherein the shield element is connected to a ground line which is connected to a ground level.

15. The circuit according to claim 1, wherein the first wiring transmits a clock signal.

16. An apparatus, comprising:
the circuit according to claim 1.

17. An apparatus for laying-out the circuit according to claim 1.

18. A circuit block for designing the circuit according to claim 1.

19. A method, comprising:
laying-out a first wiring which transmits a first signal;
laying-out an alteration element to adjust a delay amount being added to the first wiring; and
laying-out a shield element to shield the alteration element from a second wiring, the second wiring transmitting a second signal,
the shield element and the alteration element being located at different layers of a substrate,
the shield element being located between the alteration element and the second wiring, and
the shield element being located at a location covering the alteration element.

20. The method according to claim 19, further comprising:
laying-out a circuit element; and
altering a connection between the circuit element and the first wiring for adjusting the delay amount.

21. The method according to claim 20, further comprising:
laying-out the circuit element as a CMOS inverter which includes a P-type MOS transistor and an N-type MOS transistor.

22. The method according to claim 21, further comprising:
connecting a source terminal of the P-type MOS transistor and a drain terminal of the P-type MOS transistor to each other;
connecting a source terminal of the N-type MOS transistor and a drain terminal of the N-type MOS transistor to each other; and
closing each of a drain terminal of the P-type MOS transistor and a drain terminal of an N-type MOS transistor.

23. The method according to claim 22, further comprising:
connecting a gate terminal of the P-type MOS transistor and the source terminal of the P-type MOS transistor to each other when the circuit element is disconnected from the first wiring; and
connecting a gate terminal of the N-type MOS transistor and the source terminal of the N-type MOS transistor to each other when the circuit element is disconnected from the first wiring.

24. The method according to claim 19, further comprising:
laying-out the shield element so that the shield element prevents the second wiring from being layed-out at a location overlapping the alteration element.

25. The method according to claim 19, further comprising:
laying-out the shield element at the location covering the alteration element with respect to a substantially perpendicular direction of the substrate.

26. The method according to claim 19, further comprising:
laying-out a first shield element substantially parallel with respect to the first wiring;
laying-out a second shield element substantially parallel with respect to the first wiring; and
laying-out the first wiring and the alteration element between the first and second shield elements.

27. The method according to claim 19, further comprising:
connecting the shield element to a voltage line which provides a voltage to the first wiring.

28. The method according to claim 19, further comprising:
connecting the shield element to a ground line which is connected to a ground level.

29. The method according to claim 19, further comprising:
transmitting a clock signal through the first wiring.

* * * * *